(12) United States Patent
Wang

(10) Patent No.: US 10,110,059 B2
(45) Date of Patent: Oct. 23, 2018

(54) CIRCUIT AND DEVICE FOR POWER SWITCHING

(71) Applicant: CLOUD NETWORK TECHNOLOGY SINGAPORE PTE. LTD., Singapore (SG)

(72) Inventor: Chia-Peng Wang, New Taipei (TW)

(73) Assignee: Cloud Network Technology Singapore Pte. Ltd., Singapore (SG)

( * ) Notice: Subject to any disclaimer, the term of this patent is extended or adjusted under 35 U.S.C. 154(b) by 205 days.

(21) Appl. No.: 15/234,242

(22) Filed: Aug. 11, 2016

(65) Prior Publication Data

US 2017/0317526 A1 Nov. 2, 2017

(30) Foreign Application Priority Data

Apr. 28, 2016 (CN) .......................... 2016 1 0275069

(51) Int. Cl.
*H02J 9/00* (2006.01)
*H02J 9/06* (2006.01)
*H03K 17/72* (2006.01)
*H03K 17/725* (2006.01)
*H01H 71/12* (2006.01)
*H03K 17/51* (2006.01)

(52) U.S. Cl.
CPC .............. *H02J 9/061* (2013.01); *H03K 17/72* (2013.01); *H03K 17/725* (2013.01); *H01H 2071/124* (2013.01); *H03K 2017/515* (2013.01)

(58) Field of Classification Search
CPC ... H02J 9/061; H03K 17/72; H03K 2017/515; H03K 17/725; H01H 2071/124
See application file for complete search history.

(56) References Cited

U.S. PATENT DOCUMENTS

| 6,204,573 B1 * | 3/2001 | Green ................... H02J 7/0031 307/64 |
| 8,373,524 B1 * | 2/2013 | Villarin .................. H01H 1/225 335/78 |
| 9,627,924 B2 * | 4/2017 | Larson ...................... H02J 9/06 |
| 9,692,254 B2 * | 6/2017 | Tomassi .................. H02J 9/061 |
| 9,973,006 B1 * | 5/2018 | Nguyen .................... H02J 4/00 |
| 2008/0290732 A1 * | 11/2008 | Hou ........................ G06F 1/266 307/64 |

* cited by examiner

*Primary Examiner* — Jared Fureman
*Assistant Examiner* — Duc M Pham
(74) *Attorney, Agent, or Firm* — ScienBiziP, P.C.

(57) ABSTRACT

A power switching device includes a primary power source, a backup power source, and a power switching circuit, and the power switching circuit can switch rapidly between the two or more power sources. The power switching circuit includes a first switching module, a second switching module, and a control module. The first switching module includes first through fourth relays, and first through fourth driving units. The first switching module also includes a first bidirectional thyristor and a second bidirectional thyristor. A power switching circuit is also provided.

20 Claims, 2 Drawing Sheets

CIRCUIT AND DEVICE FOR POWER SWITCHING

FIELD

The subject matter herein generally relates to a device and a circuit for power switching.

BACKGROUND

An automatic transfer switch is used to switch power among two power sources. The automatic transfer switch should keep operating to be ready to switch power. That will cost lot of electric energy.

BRIEF DESCRIPTION OF THE DRAWINGS

Implementations of the present technology will now be described, by way of example only, with reference to the attached figures.

DETAILED DESCRIPTION

Figure 1:
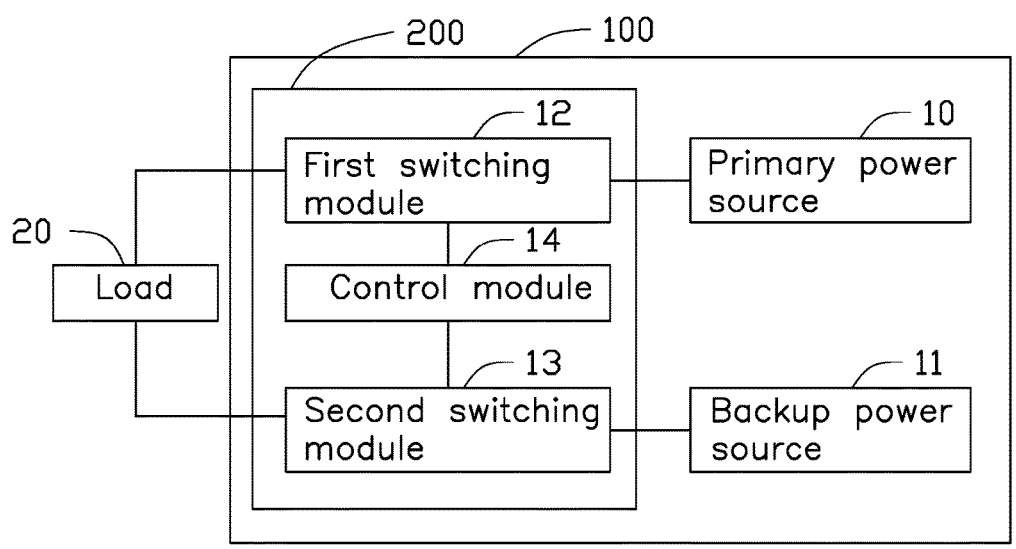
FIG. 1 is a block diagram of an embodiment of a power switching device of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure will now be described in relation to a power switching device.

FIG. 1 illustrates an embodiment of a power switching device 100.

The power switching device 100 can comprise a primary power source 10, a backup power source 11, and a power switching circuit 200.

The power switching circuit 200 can comprise a first switching module 12, a second switching module 13, and a control module 14.

The primary power source 10 is coupled to the first switching module 12. The backup power source 11 is coupled to the second switching module 13. The control module 14 is coupled to the first switching module 12 and the second switching module 13.

The first switching module 12 and the second switching module 13 are coupled to a load 20.

The first switching module 12 is coupled to the primary power source 10 to transmit power from the primary power source 10 to the load 20. When the primary power source 10 fails to supply a voltage for the operating of the load 20, the control module 14 controls the first switching module 12 to disconnect the connection between the primary power source 10 and the load 20, and the control module 14 controls the second switching module 13 to connect the backup power source 11 to the load 20. The backup power source 11 then supplies power for the load 20.

Figure 2:
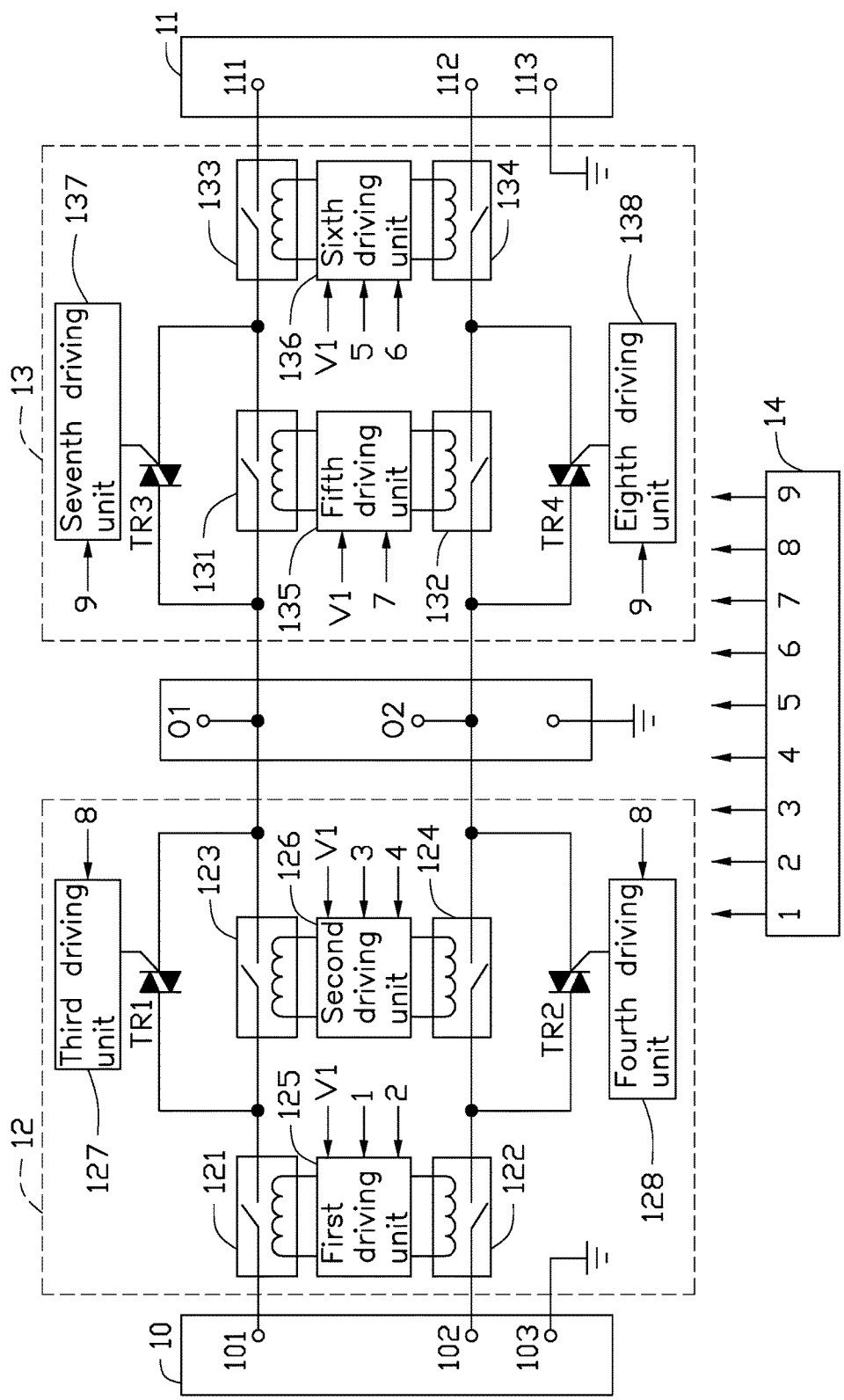
FIG. 2 is a circuit diagram of the embodiment of the power switching device in FIG. 1.

FIG. 2 illustrates a circuit of the power switching device 100.

The first switching module 12 can comprise a first relay 121, a second relay 122, a third relay 123, a fourth relay 124, a first driving unit 125, a second driving unit 126, a third driving unit 127, a fourth driving unit 128, a first bidirectional thyristor TR1, and a second bidirectional thyristor TR2.

The second switching module 13 can comprise a fifth relay 131, a sixth relay 132, a seventh relay 133, an eighth relay 134, a fifth driving unit 135, a sixth driving unit 136, a seventh driving unit 137, an eighth driving unit 138, a third bidirectional thyristor TR3, and a fourth bidirectional thyristor TR4.

The control module 14 can comprise a first reset terminal 1, a first set terminal 2, a second reset terminal 3, a second set terminal 4, a third reset terminal 5, a third set terminal 6, a first signal terminal 7, a second signal terminal 8, and a third signal terminal 9.

A first terminal of the first relay 121 is coupled to a first terminal 101 of the primary power source 10. A second terminal of the first relay 121 is coupled to a first terminal of the third relay 123. A second terminal of the first relay 121 is coupled to a first terminal of the first bidirectional thyristor TR1. A third terminal and a fourth terminal of the first relay 121 is coupled to the first driving unit 125.

A first terminal of the second relay 122 is coupled to a second terminal 102 of the primary power source 10. A second terminal of the second relay 122 is coupled to a first terminal of the fourth relay 124. A second terminal of the second relay 122 is coupled to a first terminal of the second bidirectional thyristor TR2. A third terminal and a fourth terminal of the second relay 122 are coupled to the first driving unit 125.

A second terminal of the third relay 123 is coupled to a first output terminal O1 of the power switching circuit 200. The second terminal of the third relay 123 is also coupled to a second terminal of the first bidirectional thyristor TR1. A third terminal and a fourth terminal of the third relay 123 are coupled to the second driving unit 126.

A second terminal of the fourth relay 124 is coupled to a second output terminal O2 of the power switching circuit 200. The second terminal of the fourth relay 124 is also coupled to a second terminal of the second bidirectional thyristor TR2. A third terminal and a fourth terminal of the fourth relay 124 are coupled to the second driving unit 126.

A control terminal of the first bidirectional thyristor TR1 is coupled to the third driving unit 127. A control terminal of the second bidirectional thyristor TR2 is coupled to the fourth driving unit 128.

A first terminal of the fifth relay 131 is coupled to a first output terminal O1 of the power switching circuit 200. The first terminal of the fifth relay 131 is also coupled to a first terminal of the third bidirectional thyristor TR3. A second terminal of the fifth relay 131 is coupled to a first terminal of the seventh relay 133. The second terminal of the fifth relay 131 is also coupled to a second terminal of the third bidirectional thyristor TR3. A third terminal and a fourth terminal of the fifth driving unit 135 are coupled to the fifth driving unit 135.

A first terminal of the sixth relay 132 is coupled to a second output terminal O2 of the power switching circuit 200. The first terminal of the sixth relay 132 is also coupled to a first terminal of the fourth bidirectional thyristor TR4. A second terminal of the sixth relay 132 is coupled to a first terminal of the eighth relay 134. The second terminal of the sixth relay 132 is also coupled to a second terminal of the fourth bidirectional thyristor TR4. A third terminal and a fourth terminal of the sixth relay 132 is coupled to the fifth driving unit 135.

A second terminal of the seventh relay 133 is coupled to a first terminal 111 of the backup power source 11. A third terminal and a fourth terminal of the seventh relay 133 are coupled to the sixth driving unit 136.

A second terminal of the eighth relay 134 is coupled to a second terminal 112 of the backup power source 11. A third terminal and a fourth terminal of the eighth relay 134 are coupled to the sixth driving unit 136.

A control terminal of the third bidirectional thyristor TR3 is coupled to the seventh driving unit 137. A control terminal of the fourth bidirectional thyristor TR4 is coupled to the eighth driving unit 138.

The primary power source 10 and the backup power source 11 are both configured to provide a voltage V1. The first driving unit 125 receives the voltage V1. The first driving unit 125 is also coupled to the first reset terminal 1 and the first set terminal 2 of the control module 14.

The second driving unit 126 receives the voltage V1. The second driving unit 126 is also coupled to the second reset terminal 3 and the second set terminal 4 of the control module 14.

The third driving unit 127 is coupled to the second signal terminal 8 of the control module 14. The fourth driving unit 128 is coupled to the second signal terminal 8 of the control module 14.

The fifth driving unit 135 receives the voltage V1. The fifth driving unit 135 is coupled to the first signal terminal 7 of the control module 14.

The sixth driving unit 136 receives the voltage V1. The sixth driving unit 136 is coupled to the third reset terminal 5 and the third set terminal 6 of the control module 14.

The seventh driving unit 137 is coupled to the third signal terminal 9 of the control module 14. The eighth driving unit 138 is coupled to the third signal terminal 9 of the control module 14.

A relay can comprise a contact switch and a coil.

In the embodiment, a contact switch and a coil of the third relay 123 is coupled in parallel with the first bidirectional thyristor TR1. The fourth relay 124 and the second bidirectional thyristor TR2 are coupled in parallel. The fifth relay 131 and the third bidirectional thyristor TR3 are coupled in parallel. The sixth relay 132 and the fourth bidirectional thyristor TR4 are coupled in parallel.

The first relay 121, the second relay 122, the third relay 123, the fourth relay 124, the seventh relay 133, and the eighth relay 134 are latching relays. Latching relays cost less energy to maintain conduction of contact switches. The fifth relay 131 and the sixth relay 132 are non-latching relays.

When the power switching device 100 starts up, the voltage V1 is ready to supply current via the first to eighth relays, 121 to 124, 131 to 134.

At start up, the control module 14 outputs signals through the first reset terminal 1, the second reset terminal 3, and the third reset terminal 5 respectively to ensure that the first relay 121, the second relay 122, the third relay 123, the fourth relay 124, the seventh relay 133, and the eighth relay 134 are turned off.

When the power switching device 100 is operating and using the primary power source 10, the control module 14 turns on the first relay 121, the second relay 122, the third relay 123, the fourth relay 124. The first terminal 101 of the primary power source 10 is coupled to the output terminal O1 of the power switching circuit 200. The second terminal 102 of the primary power source 10 is coupled to the output terminal O2 of the power switching circuit 200. The primary power source 10 supplies power for the load 20.

After the primary source 10 is coupled to the output terminals, the first bidirectional thyristor TR1 and the second bidirectional thyristor TR2 is turn off.

After the primary source 10 is coupled to the output terminals, the control module 14 outputs control signals through the third set terminal 6 to control the sixth driving unit 136 to turn on the seventh relay 133 and the eighth relay 134.

When the power switching device 100 is operating and using the primary power source 10, the third bidirectional thyristor TR3, the fourth bidirectional thyristor TR4, the relay 131, and relay 132 are off.

When the power switching device 100 operates and needs to switch from the primary power source 10 to the backup power source 11, the control module 14 turns on the first bidirectional thyristor TR1 and the second bidirectional thyristor TR2, and the control module 14 turns off the first relay 121, the second relay 122, the third relay 123, and the fourth relay 124. The third relay 123 and the fourth relay 124 are turned off at zero voltage. The primary power source 10 is disconnected from the power switching circuit 200. Then the control module 14 outputs control signals through the third signal terminal 9 to turn on the third bidirectional thyristor TR3 and the fourth bidirectional thyristor TR4. The control module 14 also outputs control signals through the first signal terminal 7 to turn on the fifth relay 131 and the sixth relay 132. The control module 14 outputs control signals through the third reset terminal 5 and the third set terminal 6 to control the sixth driving unit 136 to turn on the seventh relay 133 and the eighth relay 134. The output terminal O1 of the power switching circuit 200 is coupled to the first terminal 111 of the backup power source 11. The output terminal O2 of the power switching circuit 200 is coupled to the second terminal 112 of the backup power source 11.

After the backup source 11 is coupled to the output terminals, the third bidirectional thyristor TR3 and the fourth bidirectional thyristor TR4 is turned off.

The control module 14 outputs control signals through the first set terminal 2 to control the first driving unit 125 to turn on the first relay 121 and the second relay 122.

When the power switching device 200 is operating and using the backup power source 11, the first bidirectional thyristor TR1, the second bidirectional thyristor TR2, the relay 123, and relay 124 are off.

Similarly, when the power switching device 1200 is operating and needs to switch from the backup power source 11 to the primary power source 10, the control module 14 turns off the seventh relay 133 and the eighth relay 134. The control module 14 turns on the first relay 121, the second relay 122, the third relay 123, and the fourth relay 124. The power switching circuit 200 is thus coupled to the primary power source 10.

The control module 14 turns on the third bidirectional thyristor TR3 and the fourth bidirectional thyristor TR4, and the control module 14 turns off the fifth relay 131, the sixth relay 132, the seventh relay 133, and the eighth relay 134. The seventh fifth relay 1331 and the eighth sixth relay 1342 are turned off at zero voltage. The backup power source 11 is disconnected from the power switching circuit 200. Then the control module 14 outputs control signals through the second signal terminal 8 to turn on the first bidirectional thyristor TR1 and the second bidirectional thyristor TR2. The control module 14 also outputs control signals to turn on the third relay 123 and the fourth relay 124. The control module 14 outputs control signals through the third reset terminal 5 and the third set terminal 6 to control the sixth driving unit 136 to turn on the seventh relay 133 and the eighth relay 134. The output terminal O1 of the power switching circuit 200 is coupled to the first terminal 101 of the primary power source 10. The output terminal O2 of the power switching circuit 200 is coupled to the second terminal 102 of the primary power source 10.

When the power switching device 100 needs to switch from the primary power source 10 to the backup power source 11, the control module 14 controls the seventh driving unit 137 and the eighth driving unit 138 to turn on the third bidirectional thyristor TR3 and the fourth bidirectional thyristor TR4. The time to conductivity of bidirectional thyristors is in the order of microseconds. The backup power source 11 can be coupled to the power switching circuit 200 to supply power in microseconds. Then the fifth relay 131 and the sixth relay 132 are turned on. The control module 14 controls the seventh driving unit 137 and the eighth driving unit 138 to turn off the third bidirectional thyristor TR3 and the fourth bidirectional thyristor TR4. The first terminal 111 of the backup power source 11 is coupled to the power switching circuit 200 through the seventh relay 133 and the fifth relay 131. The second terminal 112 of the backup power source 11 is coupled to the power switching circuit 200 through the eighth relay 134 and the sixth relay 132.

Similarly, when the power switching device 200 needs to switch from the backup power source 11 to the primary power source 10, the control module 14 controls the third driving unit 127 and the fourth driving unit 128 to turn on the first bidirectional thyristor TR1 and the second bidirectional thyristor TR2. The time to conductivity of bidirectional thyristors is in the order of microseconds. The backup power source 10 can be coupled to the power switching circuit 200 to supply power in microseconds. Then the third relay 123 and the fourth relay 124 are turned on. The control module 14 controls the third driving unit 127 and the fourth driving unit 128 to turn off the first bidirectional thyristor TR1 and the second bidirectional thyristor TR2. The first terminal 101 of the primary power source 10 is coupled to the power switching circuit 200 through the first relay 121 and the third relay 123. The second terminal 102 of the primary power source 10 is coupled to the power switching circuit 200 through the second relay 122 and the fourth relay 124

At power off, the control module 14 outputs signals through the first reset terminal 1, the second reset terminal 3, and the third reset terminal 5 respectively to ensure that the first relay 121, the second relay 122, the third relay 123, the fourth relay 124, the seventh relay 133, and the eighth relay 134 are turned off.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A power switching device, comprising:
   a primary power source;
   a backup power source; and
   a power switching circuit, comprising:
   a first switching module coupled to the primary power source;
   a second switching module coupled to the backup power source; and
   a control module coupled to the first switching module and the second switching module;
   wherein the first switching module comprises a first relay, a second relay, a third relay, a fourth relay, a first driving unit, a second driving unit, a third driving unit, a fourth driving unit, a first bidirectional thyristor, and a second bidirectional thyristor;
   the control module is configured to control the first through fourth driving units, the first driving unit is configured to control the first relay and the second relay, the second driving unit is configured to control the third relay and the fourth relay, the third relay and the first bidirectional thyristor are coupled in parallel, the fourth relay and the second bidirectional thyristor are coupled in parallel, the third driving unit is configured to control the first bidirectional thyristor, and the fourth driving unit is configured to control the second bidirectional thyristor.

2. The power switching device of claim 1, wherein a primary power source first terminal is coupled to a power switching circuit first output terminal through the first relay and the third relay in that order, a primary power source second terminal is coupled to a power switching circuit second output terminal through the second relay and the fourth relay in that order, the third driving unit is coupled to a first bidirectional thyristor control terminal, and the fourth driving unit is coupled to a second bidirectional thyristor control terminal.

3. The power switching device of claim 2, wherein the second switching module comprises a fifth relay, a sixth relay, a seventh relay, an eighth relay, a fifth driving unit, a sixth driving unit, a seventh driving unit, an eighth driving unit, a third bidirectional thyristor, and a fourth bidirectional thyristor; the control module is configured to control the fifth through eighth driving units, a backup power source first terminal is coupled to the power switching circuit first output terminal through the seventh relay and the fifth relay in that order, a backup power source second terminal is coupled to the power switching circuit second output terminal through the eighth relay and the sixth relay in that order, the fifth driving unit is configured to control the fifth relay and the sixth relay, the sixth driving unit is configured to control the seventh relay and the eighth relay, the fifth relay and the third bidirectional thyristor are coupled in parallel, the sixth relay and the fourth bidirectional thyristor are coupled in parallel, the seventh driving unit is coupled to a third bidirectional thyristor control terminal to control the third bidirectional thyristor, and the eighth driving unit is coupled to a fourth bidirectional thyristor control terminal to control the fourth bidirectional thyristor.

4. The power switching device of claim 3, wherein the first relay, the second relay, the third relay, the fourth relay, the seventh relay, and the eighth relay are latching relays, the fifth relay, the sixth relay are non-latching relays.

5. The power switching device of claim 3, wherein when the primary power source is switched supplying power, the first bidirectional thyristor and the second bidirectional thyristor are turned off; when the backup source is switched supplying power, the third bidirectional thyristor and the fourth bidirectional thyristor is turned off.

6. The power switching device of claim 3, wherein when the control module turns on the first bidirectional thyristor and the second bidirectional thyristor, the third relay and the fourth relay are turned off at zero voltage, when the control module turns on the third bidirectional thyristor and the fourth bidirectional thyristor, the fifth relay and the sixth relay are turned off at zero voltage.

7. The power switching device of claim 3, wherein the control module is further configured to output reset signals to turn off the first relay, the second relay, the third relay, the fourth relay, the seventh relay, and the eighth relay in response to the power switching device starting up or the power switching device being power off, and the control module transmits the reset signals to the first driving unit, the second driving unit, and the sixth driving unit in that random order.

8. The power switching device of claim 3, wherein the control module is further configured to output reset signals to turn off the first relay, the second relay, the third relay, the fourth relay, the seventh relay, and the eighth relay in response to the power switching device starting up or the power switching device being power off, and the control module transmits the reset signals to the first driving unit, the second driving unit, and the sixth driving unit in sequence order.

9. The power switching device of claim 3, wherein the control module is further configured to output reset signals to turn off the first relay, the second relay, the third relay, the fourth relay, the seventh relay, and the eighth relay in response to the power switching device starting up or the power switching device being power off, and the control module simultaneously transmits the reset signals to the first driving unit, the second driving unit, and the sixth driving unit.

10. The power switching device of claim 3, wherein the primary power source and the backup power source are configured to supply a voltage for the first driving unit, the second driving unit, the fifth driving unit, and the sixth driving unit.

11. A power switching circuit coupled between a primary power source and a backup power source, comprising:
a first switching module coupled to the primary power source;
a second switching module coupled to the backup power source; and
a control module coupled to the first switching module and the second switching module;
wherein the first switching module comprises a first relay, a second relay, a third relay, a fourth relay, a first driving unit, a second driving unit, a third driving unit, a fourth driving unit, a first bidirectional thyristor, and a second bidirectional thyristor;
the control module is configured to control the first through fourth driving units, the first driving unit is configured to control the first relay and the second relay, the second driving unit is configured to control the third relay and the fourth relay, the third relay and the first bidirectional thyristor are coupled in parallel, the fourth relay and the second bidirectional thyristor are coupled in parallel, the third driving unit is configured to control the first bidirectional thyristor, and the fourth driving unit is configured to control the second bidirectional thyristor.

12. The power switching circuit of claim 11, wherein a primary power source first terminal is coupled to a power switching circuit first output terminal through the first relay and the third relay in that order, a primary power source second terminal is coupled to a power switching circuit second output terminal through the second relay and the fourth relay in that order, the third driving unit is coupled to a first bidirectional thyristor control terminal, and the fourth driving unit is coupled to a second bidirectional thyristor control terminal.

13. The power switching circuit of claim 12, wherein the second switching module comprises a fifth relay, a sixth relay, a seventh relay, an eighth relay, a fifth driving unit, a sixth driving unit, a seventh driving unit, an eighth driving unit, a third bidirectional thyristor, and a fourth bidirectional thyristor; the control module is configured to control the fifth through eighth driving units, a backup power source first terminal is coupled to the power switching circuit first output terminal through the seventh relay and the fifth relay in that order, a backup power source second terminal is coupled to the power switching circuit second output terminal through the eighth relay and the sixth relay in that order, the fifth driving unit is configured to control the fifth relay and the sixth relay, the sixth driving unit is configured to control the seventh relay and the eighth relay, the fifth relay and the third bidirectional thyristor are coupled in parallel, the sixth relay and the fourth bidirectional thyristor are coupled in parallel, the seventh driving unit is coupled to a third bidirectional thyristor control terminal to control the third bidirectional thyristor, and the eighth driving unit is coupled to a fourth bidirectional thyristor control terminal to control the fourth bidirectional thyristor.

14. The power switching circuit of claim 13, wherein the first relay, the second relay, the third relay, the fourth relay, the seventh relay, and the eighth relay are latching relays, the fifth relay and the sixth relay are non latching relays.

15. The power switching circuit of claim 13, wherein when the primary power source is switched supplying power, the first bidirectional thyristor and the second bidirectional thyristor are turned off; when the backup source is switched supplying power, the third bidirectional thyristor and the fourth bidirectional thyristor is turned off.

16. The power switching circuit of claim 13, wherein when the control module turns on the first bidirectional thyristor and the second bidirectional thyristor, the third relay and the fourth relay are turned off at zero voltage, when the control module turns on the third bidirectional thyristor and the fourth bidirectional thyristor, the fifth relay and the sixth relay are turned off at zero voltage.

17. The power switching circuit of claim 13, wherein the control module is further configured to output reset signals to turn off the first relay, the second relay, the third relay, the fourth relay, the seventh relay, and the eighth relay in response to the power switching device starting up or the power switching device being power off, and the control module transmits the reset signals to the first driving unit, the second driving unit, and the sixth driving unit in random order.

18. The power switching circuit of claim 13, wherein the control module is further configured to output reset signals to turn off the first relay, the second relay, the third relay, the fourth relay, the seventh relay, and the eighth relay in response to the power switching device starting up or the power switching device being power off, and the control module transmits the reset signals to the first driving unit, the second driving unit, and the sixth driving unit in sequence order.

19. The power switching circuit of claim 13, wherein the control module is further configured to output reset signals to turn off the first relay, the second relay, the third relay, the fourth relay, the seventh relay, and the eighth relay in response to the power switching device starting up or the power switching device being power off, and the control module simultaneously transmits the reset signals to the first driving unit, the second driving unit, and the sixth driving unit.

20. The power switching circuit of claim 13, wherein the primary power source and the backup power source are configured to supply a voltage for the first driving unit, the second driving unit, the fifth driving unit, and the sixth driving unit.

* * * * *